United States Patent
Chen et al.

(10) Patent No.: US 9,500,857 B2
(45) Date of Patent: Nov. 22, 2016

(54) MICROELECTROMECHANICAL SYSTEM DEVICE HAVING A HINGE LAYER

(71) Applicant: Himax Display, Inc., Tainan (TW)

(72) Inventors: Hui-Lun Chen, Tainan (TW); Wei-Hsiao Chen, Tainan (TW); Chien-Tang Wang, Tainan (TW); Nan Liu, San Jose, CA (US); Roland V. Gelder, Cupertino, CA (US); Chun-Hao Su, Tainan (TW)

(73) Assignee: Himax Display, Inc., Tainan (TW)

( * ) Notice: Subject to any disclaimer, the term of this patent is extended or adjusted under 35 U.S.C. 154(b) by 167 days.

(21) Appl. No.: 14/449,940

(22) Filed: Aug. 1, 2014

(65) Prior Publication Data
US 2016/0033759 A1    Feb. 4, 2016

(51) Int. Cl.
*G02B 26/00*    (2006.01)
*G02B 26/08*    (2006.01)
*B81B 3/00*     (2006.01)

(52) U.S. Cl.
CPC ......... *G02B 26/0841* (2013.01); *B81B 3/0013* (2013.01); *B81B 3/0021* (2013.01); *B81B 2201/045* (2013.01)

(58) Field of Classification Search
CPC .. G02B 26/005; G02B 26/348; G02B 26/02; G02B 26/007; G02B 26/023; G02B 26/0841; G02B 26/085; G02B 26/0858; G02B 26/0866; B81B 2201/045; B81B 2201/047; B81B 3/0013
USPC ......... 359/198.1–199.4, 200.6–200.8, 202.1, 359/221.2, 223.1–225.1, 226.2, 904, 359/290–295, 838, 846, 871, 872; 250/204, 250/559.06, 559.29, 230, 234; 347/255–260; 353/39, 98–99; 385/15–18, 22; 398/12, 19, 45
See application file for complete search history.

(56) References Cited

U.S. PATENT DOCUMENTS

| 5,061,049 A * | 10/1991 | Hornbeck | G02B 6/12004 348/203 |
|---|---|---|---|
| 7,483,198 B2 * | 1/2009 | Doan | B82Y 30/00 359/291 |
| 8,780,434 B1 * | 7/2014 | Atnip | B81C 1/00642 359/290 |
| 2004/0263936 A1 * | 12/2004 | Nanjyo | G02B 26/0841 359/212.1 |
| 2013/0194649 A1 * | 8/2013 | Zhou | H02N 1/002 359/230 |

* cited by examiner

*Primary Examiner* — Bumsuk Won
*Assistant Examiner* — Tamara Y Washington
(74) *Attorney, Agent, or Firm* — J.C. Patents

(57) ABSTRACT

A microelectromechanical system (MEMS) device includes a substrate and at least one MEMS unit disposed on the substrate. The MEMS unit includes at least one first electrode, at least one second electrode, at least one landing element, and a hinge layer. The first electrode is disposed on the substrate. The second electrode is disposed on the substrate. The landing element is disposed on the substrate. The hinge layer includes a hinge portion and at least one cantilever portion. The hinge portion is connected to the second electrode. The cantilever portion is connected to the hinge portion. The cantilever portion has a first opening and at least one spring disposed in the first opening and connected to at least one side of the first opening. When a voltage difference exists between the first electrode and the second electrode, the hinge portion is distorted and the spring thus touches the landing element.

12 Claims, 9 Drawing Sheets

MICROELECTROMECHANICAL SYSTEM DEVICE HAVING A HINGE LAYER

BACKGROUND OF THE INVENTION

1. Field of the Invention

The invention relates to a microelectromechanical system (MEMS) device.

2. Description of Related Art

Along with the development of the technology, a mechanical device may be made smaller. For example, a tiny mechanical device, e.g. a MEMS device, may be manufactured by semiconductor processes, and the MEMS device may be driven by electricity. As a result, an apparatus or device, e.g. an electronic device, including the MEMS device may be made smaller or achieve more or better functions by using a large amount of the MEMS units.

A digital micro-mirror device (DMD) is a kind of MEMS device and has a plurality of micro-mirrors arranged in an array and driven by electricity. The DMD may serve as a reflective display panel. Compared with a liquid crystal display panel which has a liquid crystal layer and polarizer that cause great light loss, the DMD has micro-mirrors with high reflectivity so as to achieve high light efficiency.

In the DMD, the swing of the micro-mirrors is driven by electrostatic force. When a micro-mirror swings to an on state, the micro-mirror reflects light from the illumination system to a projection lens. When the micro-mirror swings to an off state, the micro-mirror reflects light to a direction deviating from the projection lens. The ratio of the period of the on state to the period of the off state of a micro-mirror determines a gray level of a pixel in a frame. How to effectively use the electrostatic force to switch the state of the micro-mirror and how to improve the lifetime of the DMD are important for achieving a display with high reliability, a wide operation window, and long lifetime.

SUMMARY OF THE INVENTION

Accordingly, the invention is directed to an MEMS device, which has a wide operation window, high reliability, and long lifetime.

According to an embodiment of the invention, a MEMS device including a substrate and at least one MEMS unit disposed on the substrate is provided. The MEMS unit includes at least one first electrode, at least one second electrode, at least one landing element, and a hinge layer. The first electrode is disposed on the substrate. The second electrode is disposed on the substrate. The landing element is disposed on the substrate. The hinge layer includes a hinge portion and at least one cantilever portion. The hinge portion is connected to the second electrode. The cantilever portion is connected to the hinge portion. The cantilever portion has a first opening and at least one spring disposed in the first opening and connected to at least one side of the first opening. When a voltage difference exists between the first electrode and the second electrode, the hinge portion is distorted and the spring thus touches the landing element.

In the MEMS device according to the embodiment of the invention, the spring touches the landing element after the hinge portion is distorted. As a result, when the voltage difference between the first electrode and the second electrode disappears, the elastic force makes the cantilever portion leave the landing element more easily, and the cantilever portion being stuck on the landing element is effectively prevented. Therefore, the response of the hinge layer to the voltage difference is improved, so that the operation windows of the magnitude and timing of the applied voltage is widened, and the reliability of the MEMS device is increased. Moreover, since the elastic force makes the cantilever portion leave the landing element more easily, the electrostatic force configured to switch the state of the hinge layer may be reduced. As a result, the force of the cantilever portion striking the landing element is reduced, so as to increase the lifetime of the MEMS device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
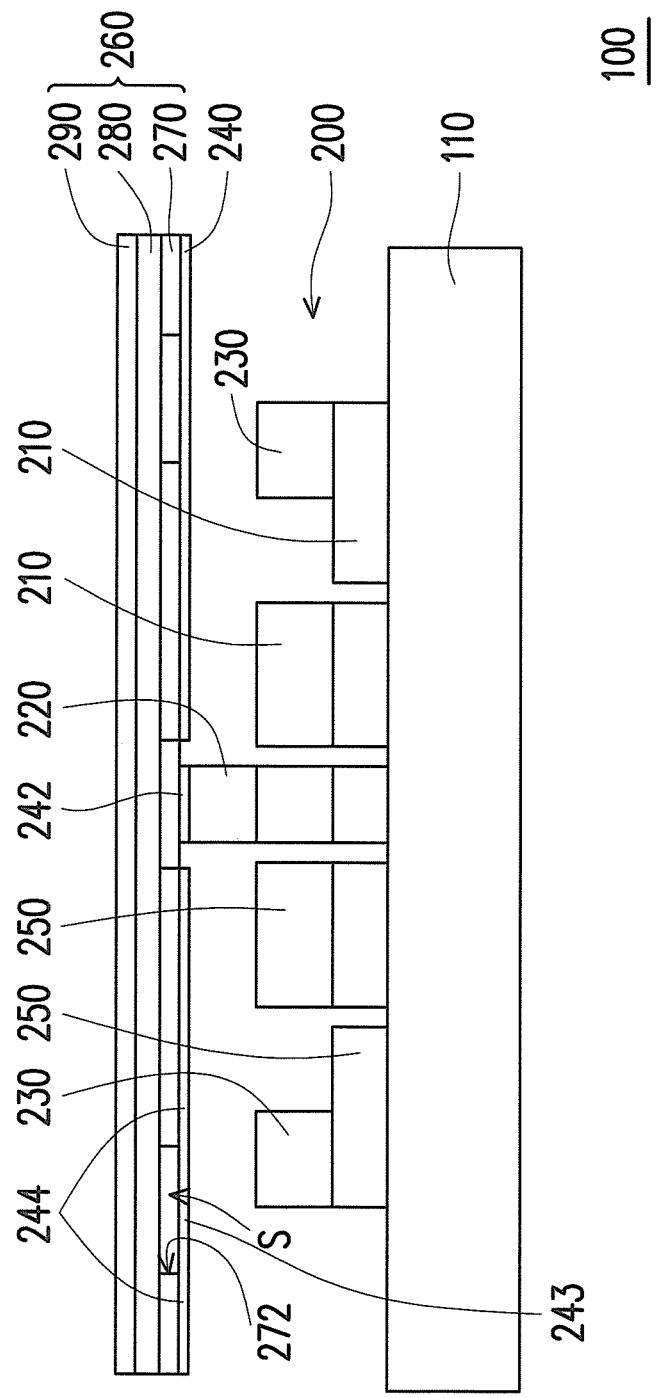
FIG. 1A is a schematic cross-sectional view of a MEMS device according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

Figure 1B:
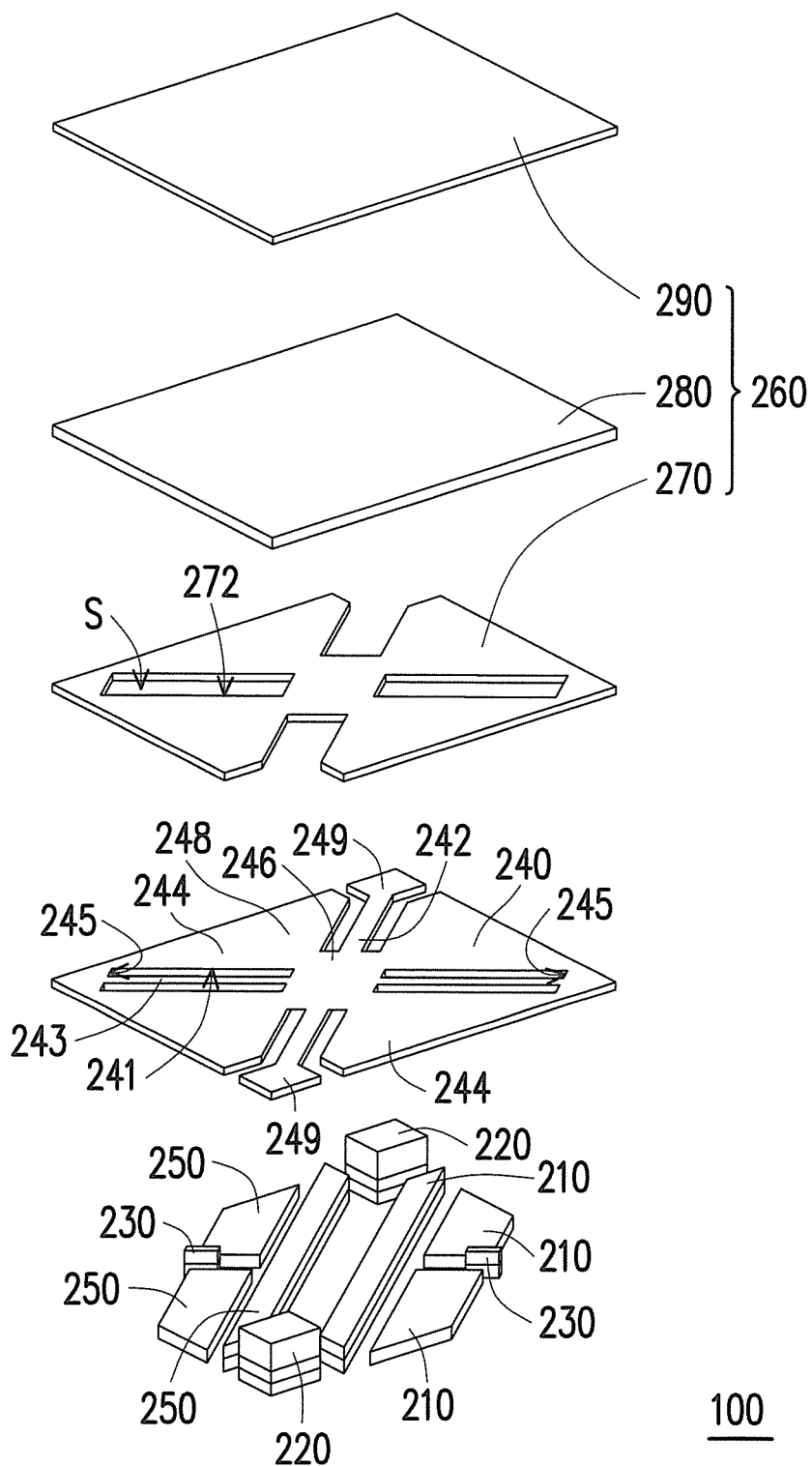
FIG. 1B is a schematic exploded view of the MEMS device in FIG. 1A.
Figure 1C:
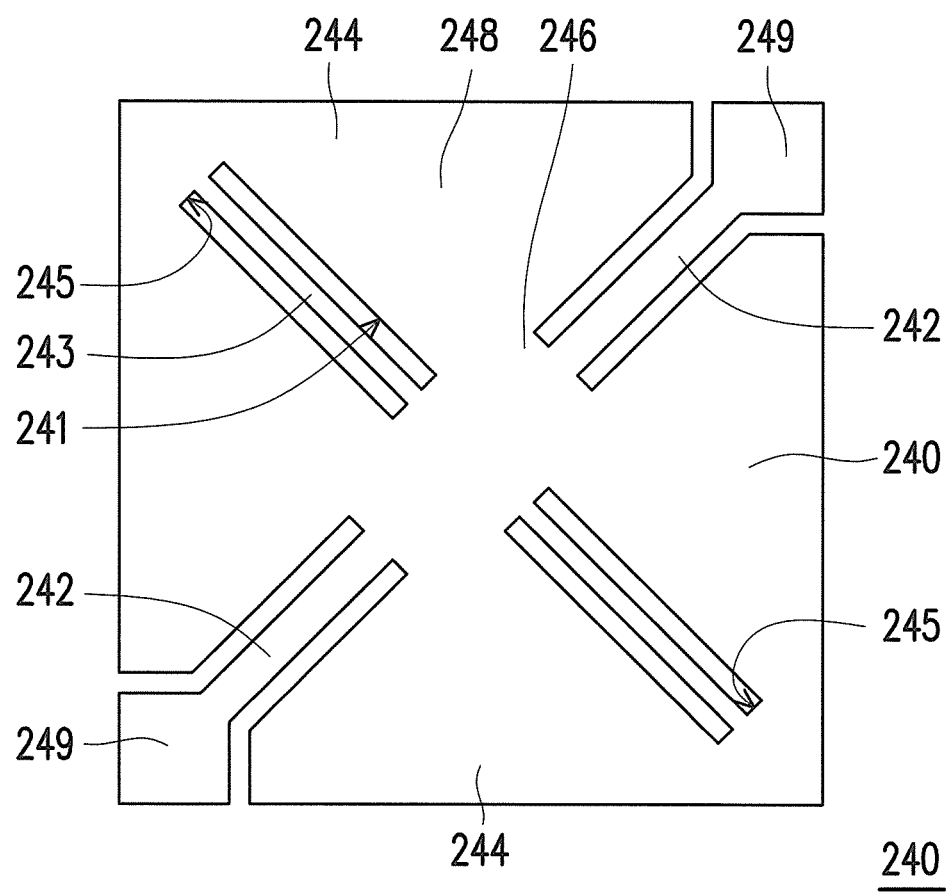
FIG. 1C is a schematic top view of the hinge layer in FIG. 1A.
Figure 2A:
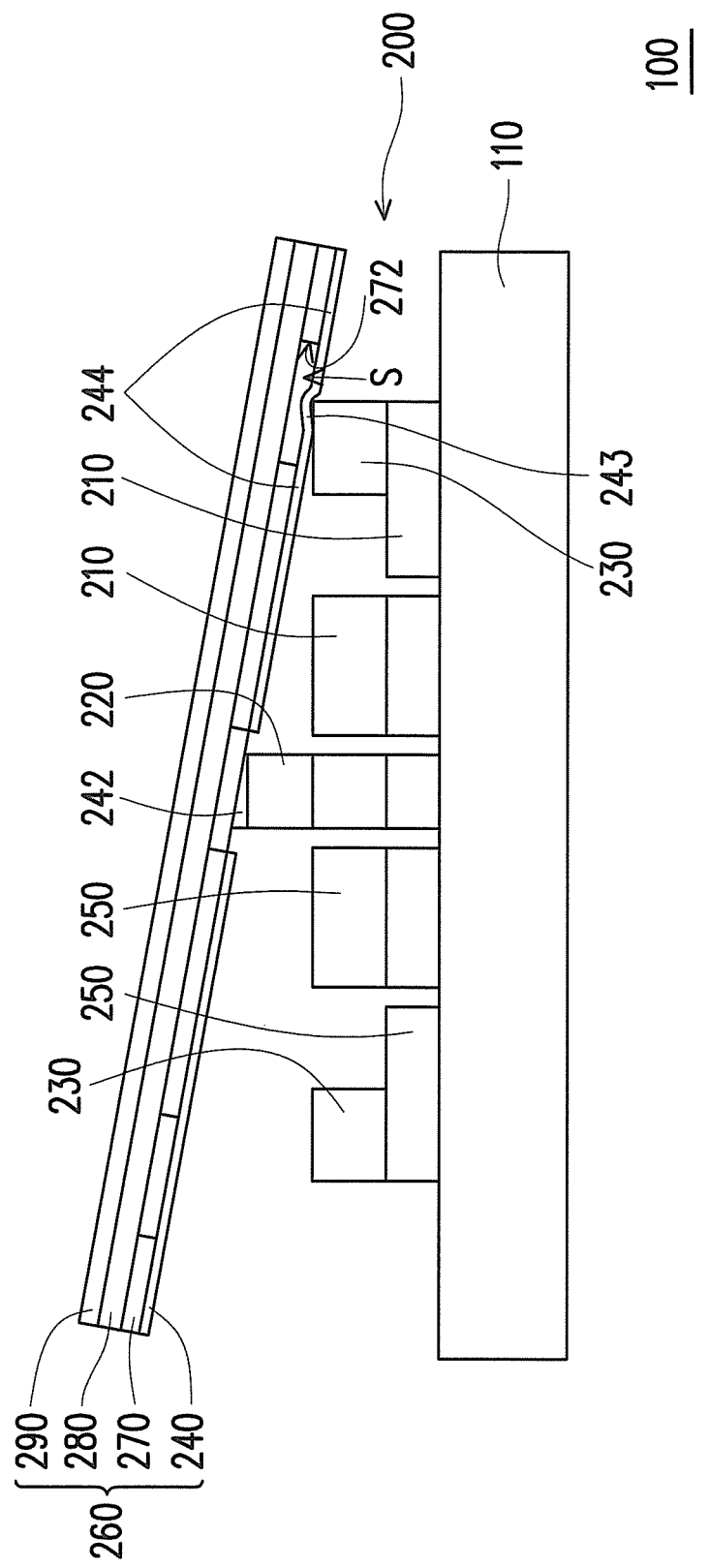
FIGS. 2A and 2B are schematic cross-sectional views of the MEMS device as shown in FIG. 1A respectively in two different states when the hinge portion is distorted.
Figure 2B:
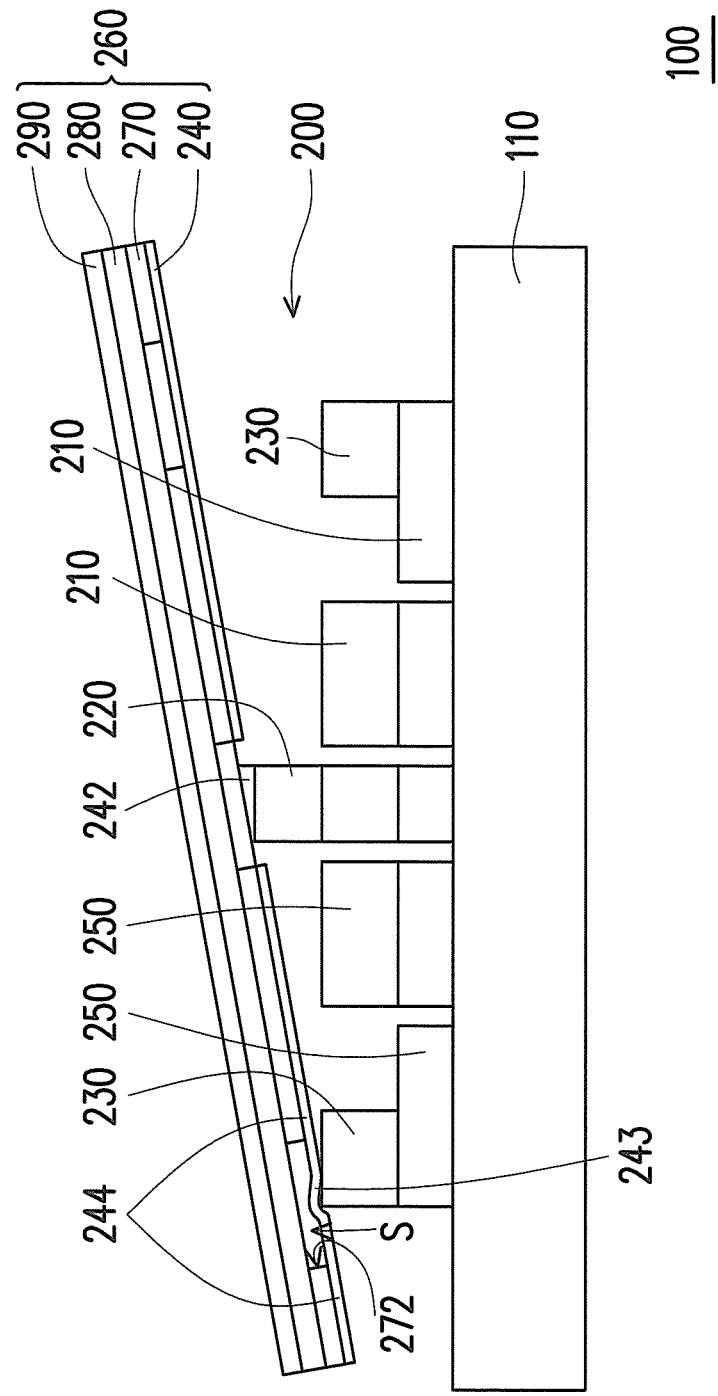

FIG. 1A is a schematic cross-sectional view of a MEMS device according to an embodiment of the invention, FIG. 1B is a schematic exploded view of the MEMS device in FIG. 1A, FIG. 1C is a schematic top view of the hinge layer in FIG. 1A, and FIGS. 2A and 2B are schematic cross-sectional views of the MEMS device as shown in FIG. 1A respectively in two different states when the hinge portion is distorted. Referring to FIGS. 1A to 1C, 2A, and 2B, the MEMS device 100 in this embodiment includes a substrate 110 and at least one MEMS unit 200 (one MEMS unit 200 is exemplarily shown in FIG. 1A) disposed on the substrate 110. The MEMS unit 200 includes at least one first electrode 210 (three first electrodes 210 are exemplarily shown in FIG. 1B), at least one second electrode 220 (two second electrodes 220 are exemplarily shown in FIG. 1B), at least one landing element 230 (two landing elements 230 are exemplarily shown in FIG. 1B), and a hinge layer 240.

The first electrodes 210, the second electrodes 220, and the landing elements 230 are disposed on the substrate 110. The hinge layer 240 includes a hinge portion 242 and at least one cantilever portion 244 (two cantilever portions 244 are exemplarily shown in FIG. 1B). The hinge portion 242 is connected to the second electrodes 220. In this embodiment, the hinge portion 242 has two opposite ends 249 respectively connected to the second electrodes 220. The cantilever portions 244 are connected to the hinge portion 242. In this embodiment, each of the cantilever portions 244 is connected to the hinge portion 242 through a narrowed connecting portion 246.

Each of the cantilever portions 244 has a first opening 241 and at least one spring 243 (one spring 243 in one first opening 241 is exemplarily shown in FIG. 1B) disposed in the first opening 241 and connected to at least one side of the first opening 241. In this embodiment, the spring 243 is connected to two opposite sides 245 of the first opening 241 so as to be connected to the main part 248, which has the first opening 241, of the cantilever portion 244. In detail, the spring 243 may be a flexible strip connected to the two opposite sides 245 of the first opening 241; that is, two opposite ends of the flexible strip are respectively connected to the two opposite sides 245 of the first opening 241. In this embodiment, the extension direction of the spring 243 is substantially perpendicular to the extension direction of the hinge portion 242.

When a voltage difference exists between the first electrode 210 and the second electrode 220, the hinge portion 242 is distorted and the spring 243 thus touches the landing element 230. In this embodiment, the hinge layer 240 includes two cantilever portions 244 respectively connected to two opposite sides of the hinge portion 242, and the MEMS unit 200 further includes at least one third electrode 250 (three third electrodes 250 are exemplarily shown in FIG. 1B) disposed on the substrate 110. The first electrode 210 and the third electrode 250 are respectively disposed under the two cantilever portions 244.

In this embodiment, both the hinge layer 240 and the landing element 230 are made of conductive material, and the hinge layer 240 is electrically connected to the second electrode 220. Therefore, a voltage applied to the second electrode 220 is also applied to the hinge layer 240.

One of the cantilever portions 244 (e.g. the right cantilever portion 244 in FIGS. 1A and 1B) moves towards the corresponding first electrodes 210 due to electrostatic force when the voltage difference exists between the first electrode 210 and the second electrode 220, so that the right spring 243 touches the right landing element 230, as shown in FIG. 2A. On the other hand, the other one of the cantilever portions 244 (e.g. the left cantilever portion 244 in FIGS. 1A and 1B) moves towards the corresponding third electrodes 250 due to electrostatic force when a voltage difference exists between the third electrode 250 and the second electrode 220, so that the hinge portion 242 is distorted and the left spring 243 thus touches the left landing element 230 as shown in FIG. 2B.

In the MEMS device 100 in this embodiment, the spring 243 touches the landing element 230 after the hinge portion 242 is distorted. As a result, when the voltage difference between the first electrode 210 and the second electrode 220 (or between the third electrode 250 and the second electrode 220) disappears, the elastic force makes the cantilever portion 244 leave the landing element 230 more easily (i.e. the cantilever portion 244 moves from the state shown in FIG. 2A (or FIG. 2B) to the state shown in FIG. 1A), and the cantilever portion 244 being stuck on the landing element 230 is effectively prevented. Therefore, the response of the hinge layer 240 to the voltage difference is improved, so that the operation windows of the magnitude and timing of the applied voltage is widened, and the reliability of the MEMS device 100 is increased.

Moreover, since the elastic force makes the cantilever portion 244 leave the landing element 230 more easily, the electrostatic force configured to switch the state of the hinge layer 240 may be reduced, e.g., by reducing the voltage difference between the first electrode 210 and the second electrode 220 (or between the third electrode 250 and the second electrode 220). As a result, the force of the cantilever portion 244 striking the landing element 230 is reduced, so as to increase the lifetime of the MEMS device 100.

In this embodiment, a same voltage is applied to the second electrode 220 and the landing element 230, so that when the cantilever portion 244 touches the landing element 230, the voltage of the cantilever portion 244 is substantially the same as the landing element 230.

In this embodiment, the substrate 110 is a silicon substrate, the first electrodes 210, the second electrodes 220, the third electrodes 250, and the landing elements 230 are made of silicon, for example, amorphous silicon. Moreover, the hinge layer 240 may be made of titanium aluminum nitride in an embodiment.

In this embodiment, the MEMS unit further includes an optical component 260 disposed on the hinge layer 240 and having at least one operation space S (two operation spaces S are exemplarily shown in FIGS. 1A and 1B) for allowing the distortion of the springs 243 of the cantilever portions 244. The operation space S communicates with the first opening 241.

In this embodiment, the optical component 260 includes a first spacer layer 270, a second spacer layer 280, and a mirror layer 290. The first spacer layer 270 is disposed on the hinge layer 240 and has at least one second opening 272 (two second openings 272 are exemplarily shown in FIGS. 1A and 1B) to form the at least one operation space S (two operation spaces S are exemplarily shown in FIGS. 1A and 1B). The second spacer layer 280 is disposed on the first spacer layer 270, and the mirror layer 290 is disposed on the second spacer layer 280. Therefore, in this embodiment, the MEMS device 100 is a mirror device capable of swinging. When the cantilever portions 244 swing to the state shown in FIG. 2A, the mirror layer 290 also swings to the state shown in FIG. 2A and reflects light to a direction. When the cantilever portions 244 swing to the state shown in FIG. 2B, the mirror layer 290 also swings to the state shown in FIG. 2B and reflects light to another direction.

However, in other embodiments, the MEMS device may not include the optical component 260, or the MEMS device may include any other appropriate component to form any other type of MEMS device, for example, a gyro or a switch.

Figure 3A:
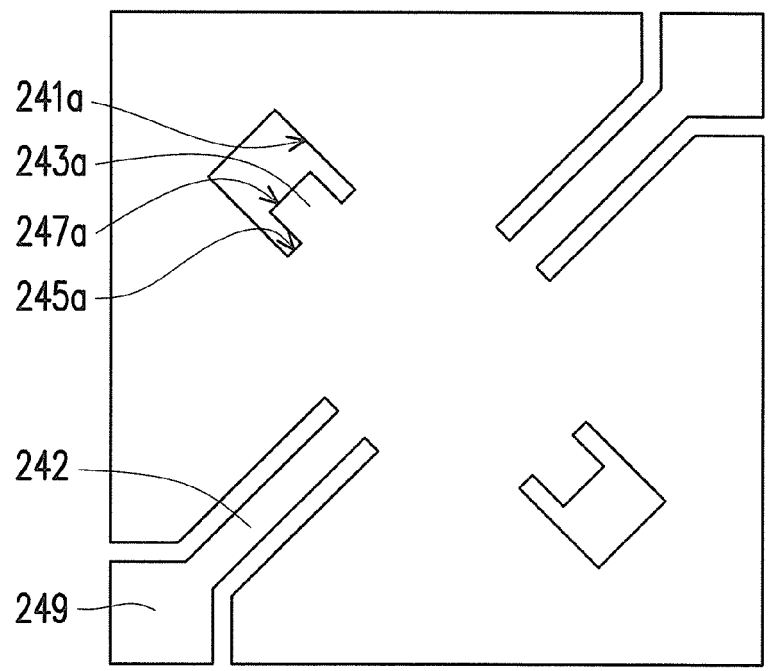
FIG. 3A is a schematic top view of a hinge layer according to another embodiment of the invention.
Figure 3B:
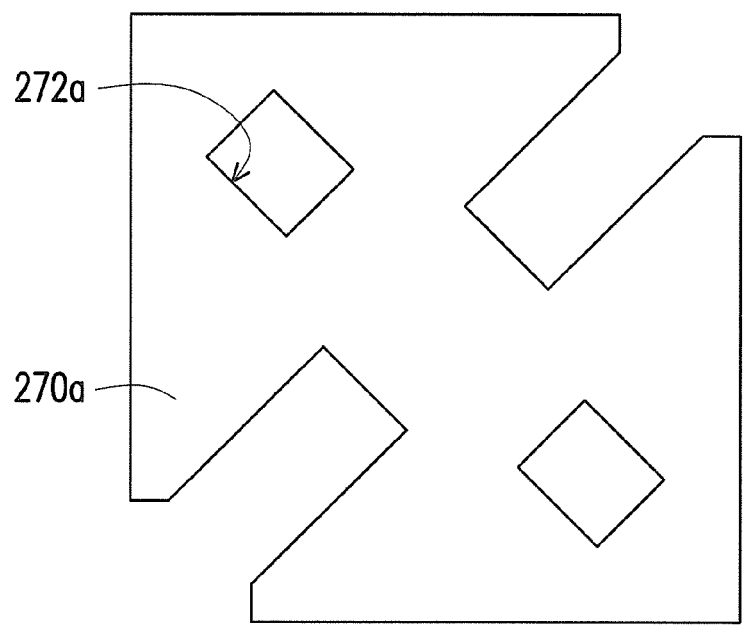
FIG. 3B is a schematic top view of a first spacer layer according to the embodiment of FIG. 3A.

FIG. 3A is a schematic top view of a hinge layer according to another embodiment of the invention, and FIG. 3B is a schematic top view of a first spacer layer according to the embodiment of FIG. 3A. Referring to FIGS. 3A and 3B, the MEMS device according to this embodiment is similar to the MEMS device 100 shown in FIGS. 1A and 1B, and the main difference is as follows. In this embodiment, each of springs 243a of the hinge layer 240a is a protrusion extending from one side 245a of a corresponding first opening 241a. Each of the springs 243a has a free end 247a away from the side 245a of the first opening 241a. When the hinge portion 242 is distorted, the free end 247a touches the landing element 230 as shown in FIG. 1B. In this embodiment, the free end 247a is a flat end. However, in other embodiments, the free end 247a may have any other appropriate shape. Moreover, in this embodiment, a first spacer 270a has second openings 272a respective communicating with the corresponding first openings 241a. The shape of the first opening 241a may be the same as or correspond to that of the corresponding second opening 272a.

Figure 4:
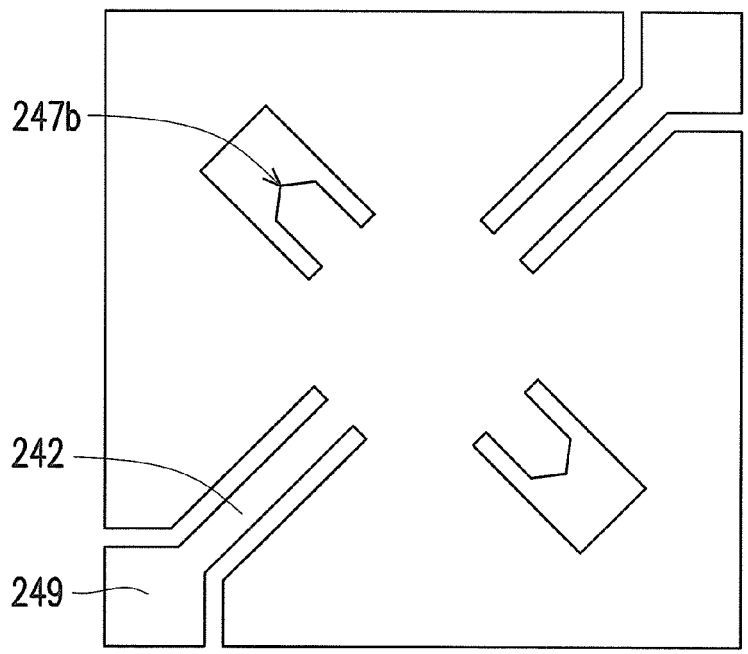
FIG. 4 is a schematic top view of a hinge layer according to another embodiment of the invention.

FIG. 4 is a schematic top view of a hinge layer according to another embodiment of the invention. Referring to FIG. 4, the hinge layer 240b in this embodiment is similar to the hinge layer 240a in FIG. 3A, and the main difference is as follows. In this embodiment, the free end 247b of the hinge layer 240b is a sharp end. When the free end 247b touches the landing element 230 as shown in FIG. 1B, the contact position is ensured to be located at the vertex of the sharp end. As a result, the hinge layer 240b may not be distorted improperly due to any other improper position of the free end 247b touching the landing element 230.

Figure 5:
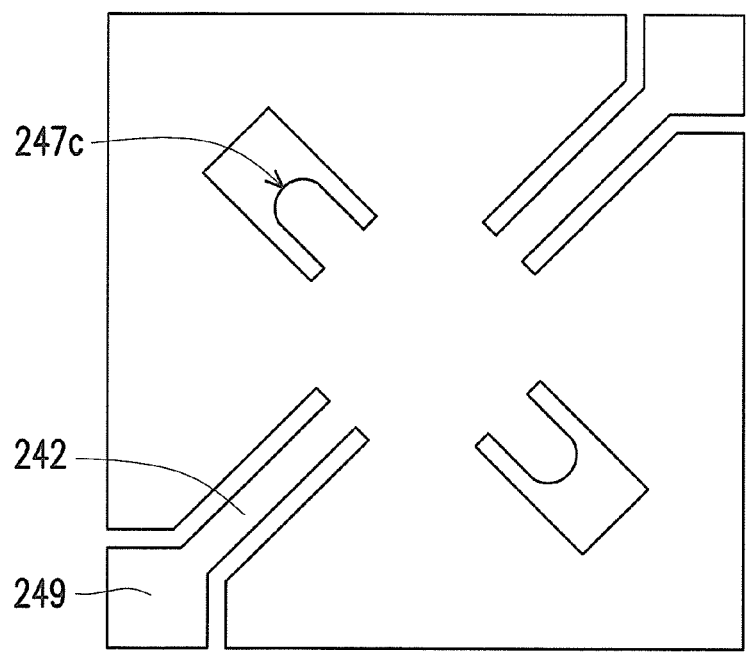
FIG. 5 is a schematic top view of a hinge layer according to another embodiment of the invention.

FIG. 5 is a schematic top view of a hinge layer according to another embodiment of the invention. Referring to FIG. 5, the hinge layer 240c in this embodiment is similar to the hinge layer 240b in FIG. 4, and the main difference is as follows. In this embodiment, the free end 247c of the hinge layer 240c is a round end.

Figure 6:
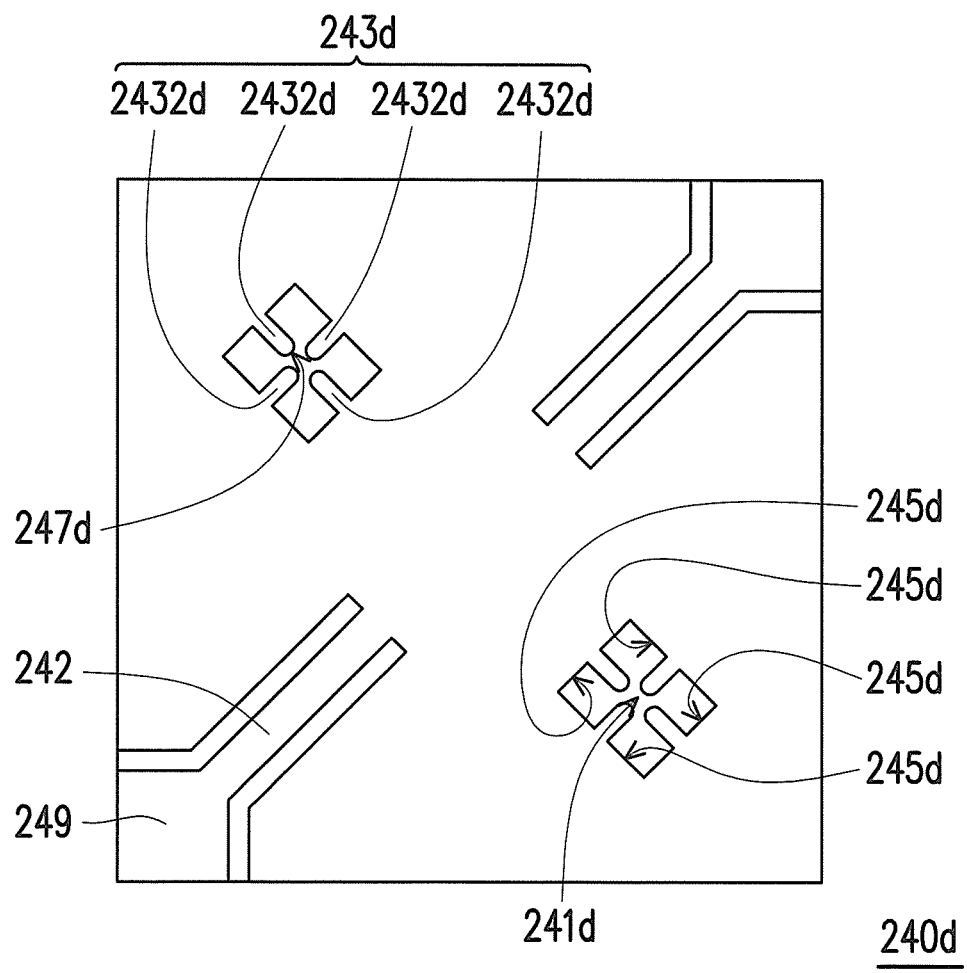
FIG. 6 is a schematic top view of a hinge layer according to another embodiment of the invention.

FIG. 6 is a schematic top view of a hinge layer according to another embodiment of the invention. Referring to FIG. 6, the hinge layer 240d in this embodiment is similar to the hinge layer 240c in FIG. 5, and the main difference is as follows. In this embodiment, each of the springs 243d includes a plurality of protrusions 2432d respectively extending from a plurality of sides 245d of the corresponding first opening 241d. When the hinge portion 242 is distorted, each of the free ends 247d of the protrusions 2432d of the spring 243d touches the corresponding landing element 230. In this embodiment, the spring 243d has four protrusions 2432d. However, in other embodiments, the spring 243d may have any one, any two, or any three of the four protrusions 2432d.

Figure 7:
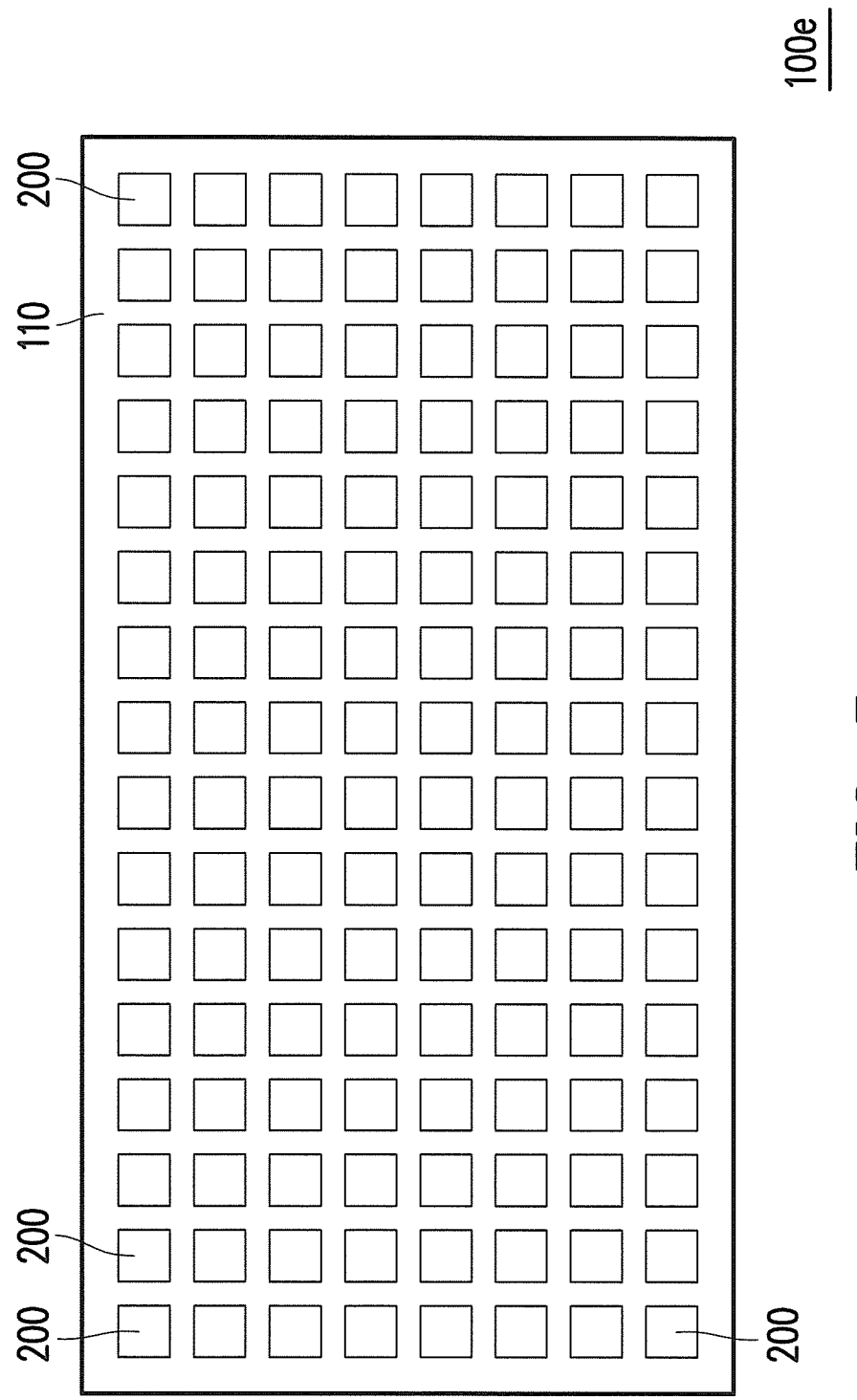
FIG. 7 is a schematic top view of a MEMS device according to another embodiment of the invention.

FIG. 7 is a schematic top view of a MEMS device according to another embodiment of the invention. Referring to FIG. 7, the MEMS device 100e in this embodiment is similar to the MEMS device 100 in FIGS. 1A and 1B, and the main difference is as follows. In this embodiment, the MEMS device 100e includes a plurality of MEMS units 200 as shown in FIGS. 1A and 1B arranged in an array on the substrate 110. That is to say, the MEMS device 100e may be a digital micro-mirror device.

In conclusion, in the MEMS device according to the embodiment of the invention, the spring touches the landing element after the hinge portion is distorted. As a result, when the voltage difference between the first electrode and the second electrode disappears, the elastic force makes the cantilever portion leave the landing element more easily, and the cantilever portion being stuck on the landing element is effectively prevented. Therefore, the response of the hinge layer to the voltage difference is improved, so that the operation windows of the magnitude and timing of the applied voltage is widened, and the reliability of the MEMS device is increased. Moreover, since the elastic force makes the cantilever portion leave the landing element more easily, the electrostatic force configured to switch the state of the hinge layer may be reduced. As a result, the force of the cantilever portion striking the landing element is reduced, so as to increase the lifetime of the MEMS device.

It will be apparent to those skilled in the art that various modifications and variations can be made to the structure of the invention without departing from the scope or spirit of the invention. In view of the foregoing, it is intended that the invention covers modifications and variations of this invention provided they fall within the scope of the following claims and their equivalents.

What is claimed is:

1. A microelectromechanical systems (MEMS) device comprising:
   a substrate; and
   at least one MEMS unit disposed on the substrate, the MEMS unit comprising:
   at least one first electrode disposed on the substrate;
   at least one second electrode disposed on the substrate;
   at least one landing element disposed on the substrate; and
   a hinge layer comprising:
   a hinge portion connected to the second electrode; and
   at least one cantilever portion connected to the hinge portion, the cantilever portion having a first opening and at least one spring disposed in the first opening and connected to at least one side of the first opening, wherein when a voltage difference exists between the first electrode and the second electrode, the hinge portion is distorted and the spring thus touches the landing element
   wherein the MEMS unit and the hinge layer are respectively located in different layers arranged along a direction away from the substrate.

2. The MEMS device according to claim 1, wherein the spring is a flexible strip connected to two opposite sides of the first opening.

3. The MEMS device according to claim 1, wherein the spring is a protrusion extending from one side of the first opening.

4. The MEMS device according to claim 3, wherein the protrusion has a free end away from the side of the first opening, and when the hinge portion is distorted, the free end touches the landing element.

5. The MEMS device according to claim 4, wherein the free end is a flat end, a sharp end, or a round end.

6. The MEMS device according to claim 1, wherein the spring comprises a plurality of protrusions respectively extending from a plurality of sides of the first opening.

7. The MEMS device according to claim 1, wherein the MEMS unit further comprises an optical component disposed on the hinge layer and having at least one operation space for allowing distortion of the spring of the at least one cantilever portion, and the operation space communicates with the first opening.

8. The MEMS device according to claim 7, wherein the optical component comprises:
   a first spacer layer disposed on the hinge layer and having at least one second opening to form the at least one operation space;
   a second spacer layer disposed on the first spacer layer; and
   a mirror layer disposed on the second spacer layer.

9. The MEMS device according to claim 1, wherein the first electrode is disposed under the cantilever portion, and a same voltage is applied to the second electrode and the landing element when the MEMS unit is in operation.

10. The MEMS device according to claim 1, wherein both the hinge layer and the landing element are made of conductive material, and the hinge layer is electrically connected to the second electrode.

11. The MEMS device according to claim 1, wherein the at least one MEMS unit is a plurality of MEMS units arranged in an array on the substrate.

12. The MEMS device according to claim 1, wherein the at least one cantilever portion is two cantilever portions respectively connected to two opposite sides of the hinge portion, and the MEMS unit further comprises at least one third electrode disposed on the substrate, the first electrode and the third electrode are respectively disposed under the two cantilever portions, one of the cantilever portions moves towards the corresponding first electrode when the voltage difference exists between the first electrode and the second electrode, and the other one of the cantilever portions moves towards the corresponding second electrode when a voltage difference exists between the third electrode and the second electrode.

* * * * *